US007078850B2

(12) United States Patent
Sakai

(10) Patent No.: US 7,078,850 B2
(45) Date of Patent: Jul. 18, 2006

(54) PIEZOELECTRIC POWER GENERATION DEVICE AND PIEZOELECTRIC CERAMICS MEMBER USED THEREFOR

(75) Inventor: Yasuhiro Sakai, Tokyo (JP)

(73) Assignee: USC Corporation, Tokyp (JP)

( * ) Notice: Subject to any disclaimer, the term of this patent is extended or adjusted under 35 U.S.C. 154(b) by 2 days.

(21) Appl. No.: 10/894,420

(22) Filed: Jul. 20, 2004

(65) Prior Publication Data

US 2006/0017353 A1 Jan. 26, 2006

(51) Int. Cl.
*H01L 41/08* (2006.01)

(52) U.S. Cl. ....................... 310/339; 310/329; 310/332

(58) Field of Classification Search ........ 310/329–332, 310/339, 345

See application file for complete search history.

(56) References Cited

U.S. PATENT DOCUMENTS 5,079,472 A * 1/1992 Uhl et al. .................. 310/332
6,411,016 B1 * 6/2002 Umeda et al. ............. 310/339

* cited by examiner

*Primary Examiner*—Mark Budd
(74) *Attorney, Agent, or Firm*—Armstrong. Kratz, Quintos, Hanson & Brooks, LLP

(57) ABSTRACT

In a piezoelectric power generation device and a piezoelectric ceramics member used in the device excellent in its power generation efficiency in which the polarization of piezoelectric ceramics elements is set to the same direction and an extremely thin metallic electrode is sandwiched in between the piezoelectric ceramics elements so that a current output obtained in the piezoelectric power generation device can be improved substantially to about two times as high as a current output obtained by a usual piezoelectric power generation device and the parasitic resonance of the electrode can be prevented, the piezoelectric power generation device generates power by applying a distortion deformation to piezoelectric ceramics members formed in plate shapes. The piezoelectric power generation device includes the piezoelectric ceramics members each having the two plate shaped piezoelectric ceramics elements whose polarization is set to the same direction and the extremely thin metallic electrode interposed between the piezoelectric ceramics elements, the piezoelectric ceramics member being formed in a laminar shape by uniting the piezoelectric ceramics elements through the metallic electrode; and the cushion materials for supporting central parts or both end parts of one surfaces of the piezoelectric ceramics members. Thus, the piezoelectric power generation device has a soft support structure in which the natural oscillation of the piezoelectric ceramics members is hardly transmitted to other structural members. A step part is formed in the piezoelectric ceramics member and the metallic electrode.

17 Claims, 6 Drawing Sheets

10(PZT)
3 10a 10b
8
10(PZT)
3
11
4
2
2
5
5
7
6
6
9B
9A
9A
9B
9C
9C

PIEZOELECTRIC POWER GENERATION DEVICE AND PIEZOELECTRIC CERAMICS MEMBER USED THEREFOR

BACKGROUND OF THE INVENTION

1. Field of the Invention

The present invention relates to a piezoelectric power generation device that can obtain output current substantially two times as much as that of a piezoelectric power generation device using a usual piezoelectric ceramics element and can prevent the parasitic resonance of a metal electrode.

2. Description of the Related Art

A piezoelectric material has various application aspects as a converting element between mechanical energy and electrical energy. As materials showing a piezoelectric effect, many materials of both inorganic materials and organic materials are well-known. As materials that are currently put to practical use, materials such as a PZT type ceramics (piezoelectric ceramics) are exemplified.

The piezoelectric ceramics element is an element provided with piezoelectric characteristics formed in such a way that high DC voltage is applied to a polycrystalline material to generate remanence. Because a basic piezoelectric constant can be relatively freely changed depending on the composition of the piezoelectric ceramics element, a use thereof is wide. Especially, the piezoelectric ceramics element composed of lead zirconate titanate (PZT) has a wide selection range of composition ratio or additives and a variety of application ranges.

FIG. 7 is an explanatory view of a usual piezoelectric power generation device. The piezoelectric power generation device is formed by uniting a piezoelectric ceramics element plate 31 to a base 32 made of an acrylic material and fixing both the end parts of the base 32 by holders 33 made of a hard material such as metal. Then, a steel ball 35 is dropped on the ceramics element plate 31 to apply mechanical impact energy due to a collision to the piezoelectric element plate 31, excite a flexural oscillation on the piezoelectric element plate 31 including the base 32 and take out electric energy.

However, although the practicability of the usual PZT type piezoelectric ceramics element is anticipated, a quantity of generated energy is very small. Thus, the usual PZT type piezoelectric ceramics element is undesirably deficient in its practicability for the piezoelectric power generation device. In the power generation device using the piezoelectric ceramics element of this type, the natural oscillation of the piezoelectric ceramics element plate 31 essentially needs to be continued as long as possible. Therefore, a support structure needs to be realized that the natural oscillation of the piezoelectric ceramics element plate 31 does not accompany a mechanical resistance. Further, in the above-described related art, because the material of the base 32 is different from the material of the piezoelectric ceramics element plate 31, a center of oscillation (a part that does not expand and contract) is hardly disposed on a uniting surface of the base 32 and the piezoelectric ceramics element plate 31. When the center appears in the piezoelectric ceramics element plate 31, a cancellation in a polarization is undesirably generated to lower power generation efficiency.

In order to solve the above-described problems of the usual power generation device, the applicant of the present invention previously proposes a piezoelectric power generation device (disclosed in Japanese Patent Application Laid-Open No. 2001-145375) shown in FIG. 8. In this piezoelectric power generation device, two plate shaped piezoelectric ceramics elements 1*a* and 1*b* are united to each other with polarization set to opposite directions to form laminar piezoelectric ceramics members 1 (PZT1) and 1 (PZT2). Then, one surface of each of the piezoelectric ceramics members 1 and 1 is struck to generate power. Thus, the power generation device good in its power generation efficiency and effective in small power generation is obtained.

It is a first object of the present invention to provide a piezoelectric power generation device excellent in its power generation efficiency in which polarization is set to the same direction differently from the previous application and an extremely thin metal electrode is sandwiched between piezoelectric ceramics elements so that a current output obtained in the piezoelectric power generation device with the above-described structure previously filed by the applicant of the present invention can be improved substantially to about twice as high as the previous current output.

It is a second object of the present invention to provide a piezoelectric power generation device that can greatly improve power generation efficiency by forming different level parts in a piezoelectric ceramics member and a metal electrode to eliminate a parasitic resonance in the piezoelectric power generation device.

SUMMARY OF THE INVENTION

In order achieve the above-described objects, a piezoelectric power generation device according to the present invention generates power by applying a distortion deformation to piezoelectric ceramics members 10 formed in plate shapes. Each of the piezoelectric ceramics members is formed by two plate shaped piezoelectric ceramics elements 10*a* and 10*b* whose polarization is set to the same direction and an extremely thin metallic electrode 11 interposed between the piezoelectric ceramics elements 10*a* and 10*b*. The piezoelectric ceramics member is formed in a laminar shape by uniting the piezoelectric ceramics elements through the metallic electrode 11. Cushion materials 3 support central parts or both end parts of one surfaces of the piezoelectric ceramics members 10. The piezoelectric power generation device has a soft support structure in which the natural oscillation of the piezoelectric ceramics members 10 is hardly transmitted to other structural members.

Further, in order to achieve the above-described objects, in the piezoelectric power generation device according to the present invention, the piezoelectric ceramics members 10 supported by the cushion materials 3 and 3 are opposed to each other and a hard striking member 4 is provided which reciprocates between both the piezoelectric ceramics members 10 and 10 to strike each piezoelectric ceramics member 10.

Further, according to the present invention, a hard striking member 4 is disposed in one or both sides of the piezoelectric ceramics members 10 and 10 supported by the cushion materials 3 and 3, which reciprocates between the piezoelectric ceramics members 10 to strike each piezoelectric ceramics member 10.

The piezoelectric ceramics member 10 used in the piezoelectric power generation device constructed as described above is obtained by forming the two piezoelectric ceramics elements 10*a* and 10*b* in the same configuration so that stable power generation efficiency can be obtained.

Further, in the present invention, the two piezoelectric ceramics elements 10*a* and 10*b* are respectively formed by uniting and laminating a plurality of sheets as described above.

In this case, a lead zirconate titanate material is used for the piezoelectric ceramics elements 10*a* and 10*b* to greatly improve a power generation efficiency.

Further, the metallic electrode 11 is made of electrically conductive metal such as phosphor bronze or brass. The thickness of the metallic electrode is desirably set to, for instance, 10 μm to 50 μm and may be set to 0.5 to 1 mm or longer when the oscillation of the electrode 11 can be suppressed to a low level.

Further, in the present invention, the two piezoelectric ceramics elements 10*a* and 10*b* are arranged uniformly in one end side, and, the end part 10*a*1 or 10*b*1 of one piezoelectric ceramics element 10*a* or 10*b* is formed longer than the other in the other side to form a step part 10*a*1 or 10*b*1, and a lead wire connecting end part 11A of the metallic electrode 11 is extended to the step part 10*a*1 or 10*b*1.

Further, in the present invention, both the end parts of the two piezoelectric ceramics elements 10*a* and 10*b* are arranged uniformly, the metallic electrode 11 protrudes outward from one end part of both the piezoelectric ceramics elements 10*a* and 10*b*, a lead wire 9C is connected to the protruding part 11A, and then, the protruding part 11A is embedded in an adhesive to be formed integrally with the piezoelectric ceramics elements 10*a* and 10*b*. Thus, the protruding part 11A of the metallic electrode 11 is prevented from having an oscillation different from the oscillation of the piezoelectric ceramics elements 10*a* and 10*b*.

DETAILED DESCRIPTION OF THE PREFERRED EMBODIMENTS

Now, the present invention will be described in detail on the basis of embodiments shown in the accompanying drawings.

Figure 1:
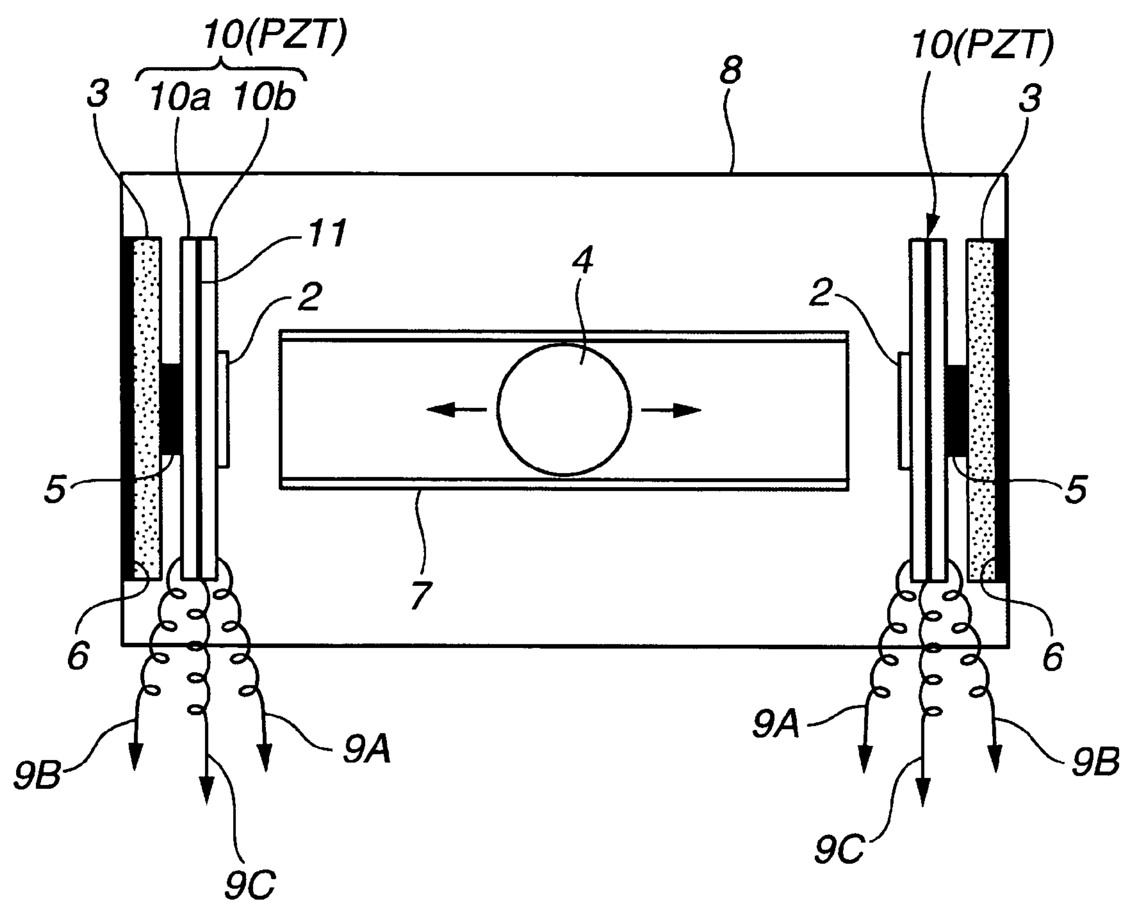
FIG. 1 is an explanatory view showing a piezoelectric power generation device according to an embodiment of the present invention.

In a power generation device shown in FIG. 1, piezoelectric ceramics members 10 are arranged at both end sides of a tubular vessel 8 with both ends closed and the piezoelectric ceramics members 10 are struck by a steel ball 4 to generate power.

To one side surface of the vessel 8, a cushion member 3 is bonded by using an adhesive 6. Only to the central part of the cushion member 3, the piezoelectric ceramics member 10 is bonded by using an adhesive 5. To the other side surface of the vessel 8, the piezoelectric ceramics member 10 is bonded in the same manner as described above and both the piezoelectric ceramics members 10 are opposed to each other.

Protector plates 2 are fixed to the central parts on the opposed surfaces of the piezoelectric ceramics members 10. Then, a pipe 7 is disposed between both the piezoelectric ceramics members 10 and the steel ball 4 is provided in the pipe 7 to freely roll.

In the present invention, for instance, when the piezoelectric ceramics members 10 are horizontally arranged, not only the central parts, but also both the end parts of the piezoelectric ceramics members 10 may be held by the cushion members 3. Otherwise, the central parts and both the end parts of the piezoelectric ceramics members may be supported by the cushion members 3 and their supporting parts may be arranged and held in the upper and lower surfaces of the piezoelectric ceramics members 10.

The piezoelectric ceramics members 10 respectively include two plate shaped piezoelectric ceramics elements 10*a* and 10*b* having the same form (the same material, the same shape and the same thickness). The polarity of polarization of each of the piezoelectric ceramics elements 10*a* and 10*b* has the same direction. Between the piezoelectric ceramics elements 10*a* and 10*b*, an extremely thin metallic electrode 11 made of electrically conductive metal such as phosphor bronze or brass and having the thickness of 10 μm to 50 μm is disposed. The piezoelectric ceramics member 10 is formed by connecting the piezoelectric ceramics elements 10*a* and 10*b* to the metallic electrode 11. According to the present invention, it is to be understood that the thickness of the metallic electrode 11 is not limited to the above-described example, and, for instance, the thickness of the metallic electrode may be 0.5 mm or longer.

The thickness of the metallic electrode 11 is set to an extremely small thickness so that a mechanical resistance due to the metallic electrode 11 can be suppressed to an excessively low level. Even when a flexural oscillation is generated in the center of a uniting plane (a part that does not expand and contract) of the two ceramics elements 10*a* and 10*b* and the metallic electrode 11, the damping of the flexural oscillation due to the metallic electrode 11 can be suppressed to a low level as much as possible. In the structure of this embodiment, when the piezoelectric ceramics element 10*a* of one side expands, the piezoelectric ceramics element 10*b* of the other side contracts and the electrodes of output voltage are opposite each other. Thus, both the piezoelectric ceramics elements 10*a* and 10*b* have a power generation structure in which they are connected in parallel with each other.

Further, in this embodiment, when the above-described flexural oscillation is generated, both the operations of expansion and contraction are carried out in one piezoelectric ceramics element 10*a* (or 10*b*), power is efficiently generated without canceling the polarization. Electric current as electric power energy generated in the ceramics element 10*a* is taken out from a lead wire 9A. Electric current as electric power energy generated in the ceramics element 10*b* is taken out from a lead wire 9B. The electric current generated respectively in the ceramics elements 10*a* and 10*b* is connected to a lead wire 9C electrically connected to both the end parts of the metallic electrode 11 to obtain alternating current.

Here, a case that the two piezoelectric ceramics elements 10_a_ and 10_b_ are laminated through the metallic electrode 11 is described as an example, however, each of the piezoelectric ceramics element 10_a_ (10_b_) itself may have a laminated structure. In this laminated structure, a plurality of piezoelectric ceramics elements are united together (in this case, the polarity of polarization is set to the same direction) to form one piezoelectric ceramics element 10_a_ (10_b_).

As described above, when the piezoelectric ceramics element 10_a_ (or 10_b_) itself has the laminated structure and the plurality of piezoelectric ceramics elements are united together by for instance, an adhesive having elastic characteristics, the piezoelectric ceramics member 10 low in its strength owing to its material is easily bent due to an elastic effect. Thus, a flexural strength of the piezoelectric ceramics member 10 can be maintained. In the present invention, the outer form of the piezoelectric ceramics member 10 is not limited to a special form. A suitable form such as a circular form, an elliptic form, a triangular form, a rectangular form or a polygonal form may be used in accordance with a way of use.

Further, the cushion material 3 used in the present invention is made of a synthetic resin material, a rubber material or a soft material obtained by forming these materials in sponge. Only central parts or both the ends of the cushion members 3 are fixed to the piezoelectric ceramics members 10 by using the adhesives 5 not to damp the oscillation of the piezoelectric ceramics members 10. When the piezoelectric ceramics members 10 oscillate, members for supporting the piezoelectric ceramics members 10 form factors for damping the oscillation of the piezoelectric ceramics members 10. To remove the damping factors, the piezoelectric ceramics members 10 are respectively brought into free states as much as possible by using the cushion members 3.

As in the present invention, the distortion of the piezoelectric ceramics members 10 forms a natural oscillation of the piezoelectric ceramics itself and continues for a while. To continuously keep this natural oscillation for a long time, it is important not to transmit the natural oscillation to other components except the piezoelectric ceramics members 10. The natural oscillation of the piezoelectric ceramics members 10 is converted to electric energy, however, the oscillation of other structural members are all forms a mechanical resistance to absorb natural oscillation energy so that the electric energy cannot be taken out. Therefore, in this embodiment, as means for realizing a soft contact that the natural oscillation is not transmitted between the piezoelectric ceramics members 10 and other structural members, the above-described cushion members 3 are used. Accordingly, the natural oscillation of the piezoelectric ceramics members 10 can be continued for a long time to improve power generation efficiency. It is to be understood that the cushion members 3 serve to mitigate an impact applied to the piezoelectric ceramics members 10. The above-described protector plates 2 are formed with metal, a synthetic resin or the like to protect the piezoelectric ceramics members 10 from striking by the steel ball 4.

In this embodiment, as the striking member, the steel ball 4 is arranged in the pipe 7 to strike the piezoelectric ceramics members 10. However, the material or the form of the striking member is not limited to a ball made of steel and other cylindrical or egg-shaped heavy materials may be used. Further, not only the striking member is disposed in the pipe 7, but also the striking member may be moved along a rail, as long as the striking member can freely move. Further, a spring material (upward or downward) may be used in place of the pipe 7, one end of the spring material may be fixed and the steel ball 4 may be attached to the other end thereof so that both the piezoelectric ceramics members 10 are struck in accordance with the rightward and leftward oscillation of the spring material.

When a piezoelectric power generation device according to this embodiment constructed as described above is placed under an environment of a prescribed moving state using wind, wave or an artificial action, the steel 4 rolls in the pipe 7 to strike the right and left piezoelectric ceramics members 10 and apply an impact energy due to collision to the piezoelectric ceramics members 10. Then, the piezoelectric ceramics members 10 are excited to oscillate and repeatedly expands and contracts to generate AC electric power. As a quantity of generated energy, what is called a parallel type power generation device according to the present invention, can obtain output current substantially twice as much as a series type power generation device previously proposed by the applicant of the present invention.

Figure 2:
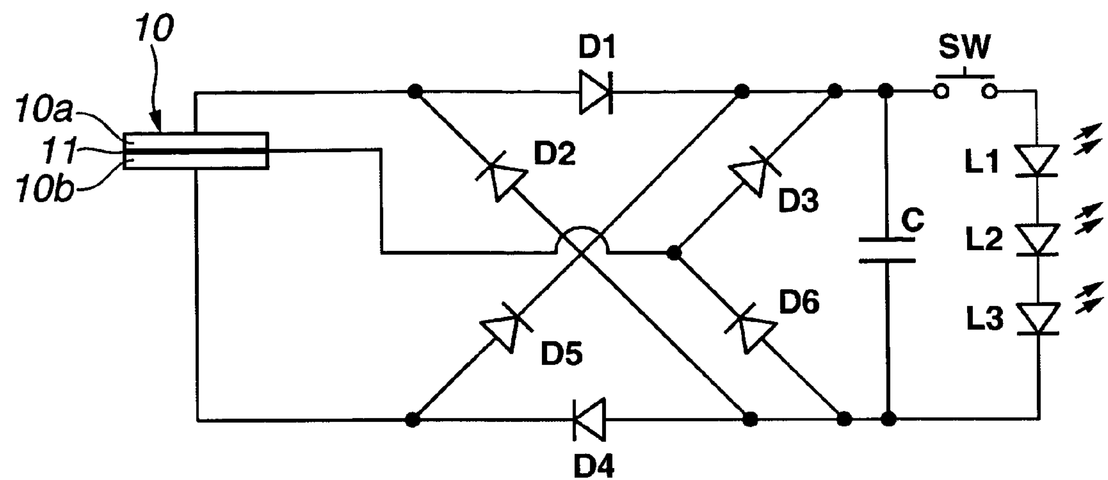
FIG. 2 is a circuit diagram of a charging device for the piezoelectric power generation device.

FIG. 2 shows a circuit of a charging device for electrifying the electric power generated by one piezoelectric ceramics member 10 by the use of the piezoelectric power generation device. In this embodiment, because it is to be understood that the two piezoelectric ceramics members 10 are opposed to each other, the charging circuit is electrically connected in parallel with or in series to the piezoelectric ceramics members. Further, the parallel circuit shown in the drawing may be suitably increased to meet a purpose of use.

Specifically, the charging circuit includes the two piezoelectric ceramics elements 10_a_ and 10_b_ as the two piezoelectric ceramics members 10, the metallic electrode 11, rectifier diodes D1 to D6, a capacitor C for storing the electric power, a switch SW and light emitting diodes L1 to L3. The electric power generated by the piezoelectric ceramics element 10_a_ is full-wave rectified by the diodes D1 to D3. The electric power generated by the piezoelectric ceramics element 10_b_ is full-wave rectified by the diodes D4 to D6. The capacitor C is charged with the full-wave rectified electric power. The number of the capacitors C may be set to one in this parallel circuit. Then, the capacitor C is discharged by operating the switch SW to light the light emitting diodes L1 to L3.

Figure 3:
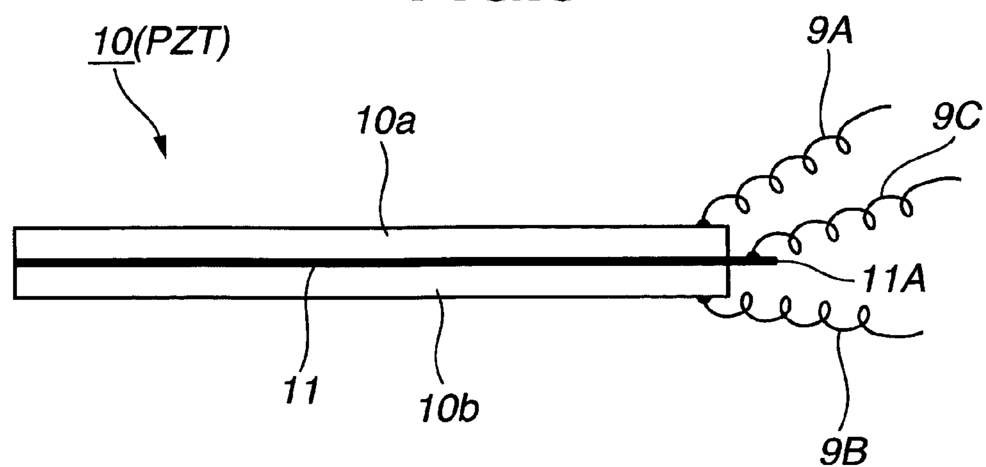
FIG. 3 is an explanatory side view showing a model of an original form of a piezoelectric ceramics member used in the present invention.

FIG. 3 shows an ordinary structural example of the piezoelectric ceramics member 10 used in the piezoelectric power generation device constructed as described above. In this example, there is no other method than a method that one end part of the metallic electrode 11 interposed between the two piezoelectric ceramics elements 10_a_ and 10_b_ protruding parts 11A outward from the other end parts of the piezoelectric ceramics elements 10_a_ and 10_b_ and the lead wire 9C is electrically connected to the protruding part 11A. However, when the protruding part 11A of the metallic electrode 11 is projected outward from the other end parts of the piezoelectric ceramics elements 10_a_ and 10_b_ as described above, the protruding part 11A oscillates under a frequency different from the distortion deformation of the piezoelectric ceramics elements 10_a_ and 10_b_. Thus, the oscillation of the protruding part 11A interferes with the power generation of the piezoelectric ceramics elements 10_a_ and 10_b_ so that an efficient power generation cannot be realized.

Therefore, the protruding part 11A of the metallic electrode 11 may be connected to the lead wire 9C, and then, effectively fixed by an adhesive or the like.

Figure 4:
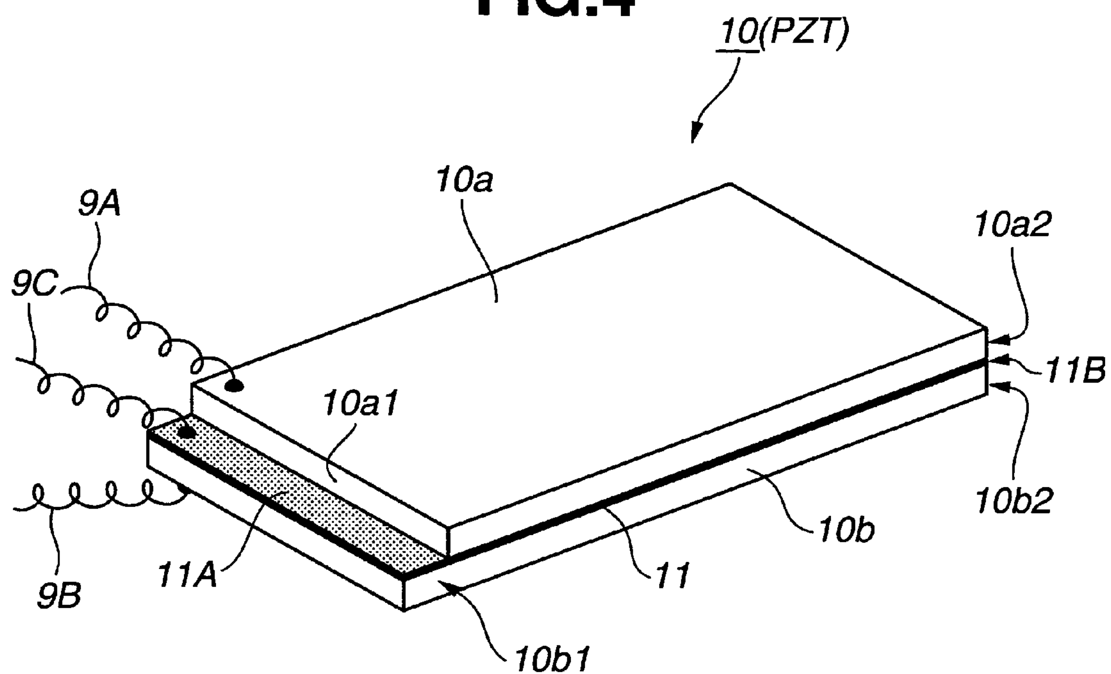
FIG. 4 is a perspective view showing an embodiment of the piezoelectric ceramics member.
Figure 5:
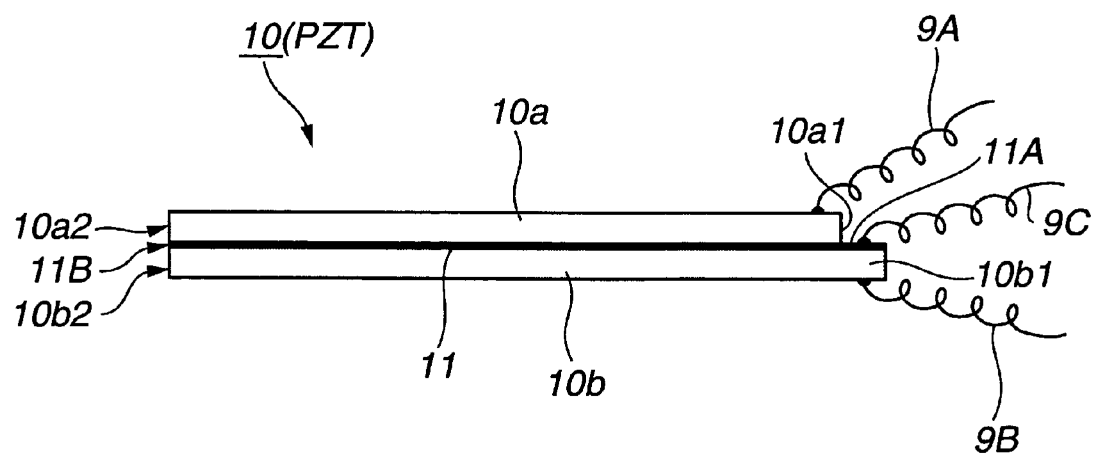
FIG. 5 is a side view of the piezoelectric ceramics member.

In the present invention, as shown in FIGS. 4 and 5, one end parts 10_a_2 and 10_b_2 of the two piezoelectric ceramics elements 10_a_ and 10_b_ are aligned with a side 11B of the metallic electrode 11. In this embodiment, the other end side

**10*b*1 is formed to be longer than the piezoelectric ceramics element 10*a* to form a step part 10*b*1. In this step part 10*b*1, the lead wire 9C is bonded and fixed to the connecting end part 11A of the metallic electrode 11 (refer this form to as an embodiment A, hereinafter). It is to be understood that the other end part 10*a*1 of the piezoelectric ceramics element 10*a* may be formed to be longer than the other end part 10*b*1 of the piezoelectric ceramics element 10*b* to form a step part, conversely to the embodiment shown in the drawings and the lead wire 9C may be bonded and fixed to the connecting end part 11A of the metallic electrode 11 in the step part 10*a*1 of the long extended piezoelectric ceramics element 10** (refer this form to as an embodiment B).

As described above, the metallic electrode 11 is supported by the step part of the piezoelectric ceramics element **10*a* or 10*b* high in its rigidity, so that the natural oscillation of the protruding part 11A of the metallic electrode 11 can be prevented. Thus, effective power generation efficiency can be obtained and the lead wire 9C can be simply connected to the metallic electrode. In this embodiment, the connecting end part 11A of the metallic electrode 11** is bonded and fixed to the step part as an example. However, the present invention is not limited thereto and the connecting end part may be deposited or plated.

Figure 6A:
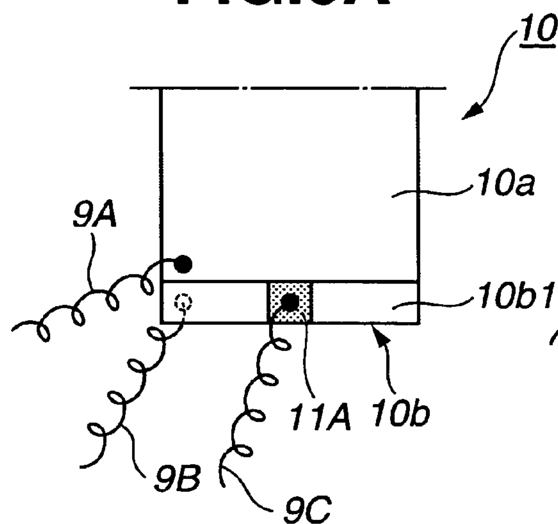
FIGS. 6A and 6B are explanatory plan views respectively showing alternative examples of an embodiment A of a piezoelectric ceramics member.
Figure 6B:
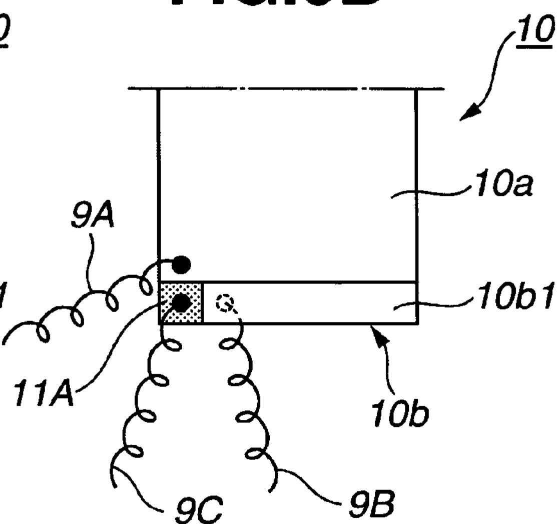

FIGS. 6A and 6B show alternative examples of the above-described embodiment A. In these examples, the connecting end part 11A relative to the lead wire 9C has a small width necessary for connection, which is different from the embodiment shown in FIGS. 4 and 5. Thus, factors that prevent an oscillation due to the connecting end part 11A of the metallic electrode 11 are eliminated as much as possible.

Figure 6C:
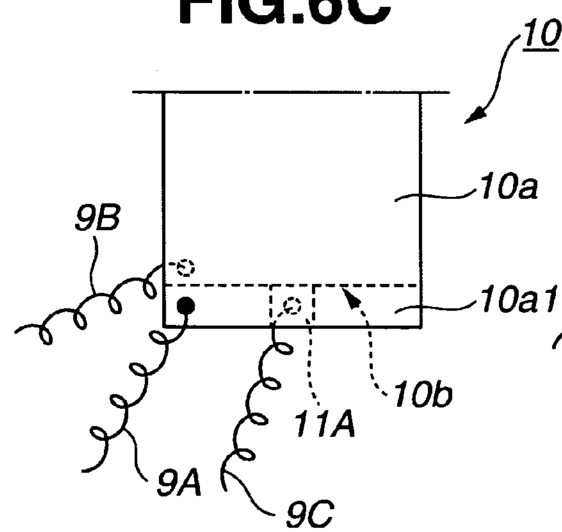
FIGS. 6C and 6D are explanatory plan views respectively showing alternative examples of an embodiment B of a piezoelectric ceramics member.
Figure 6D:
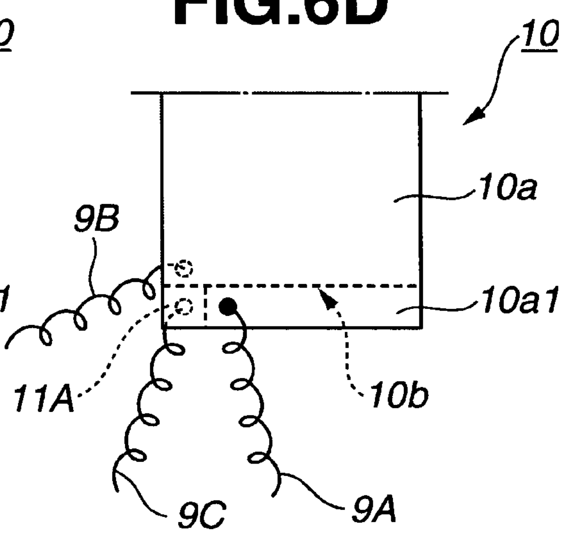
Figure 7:
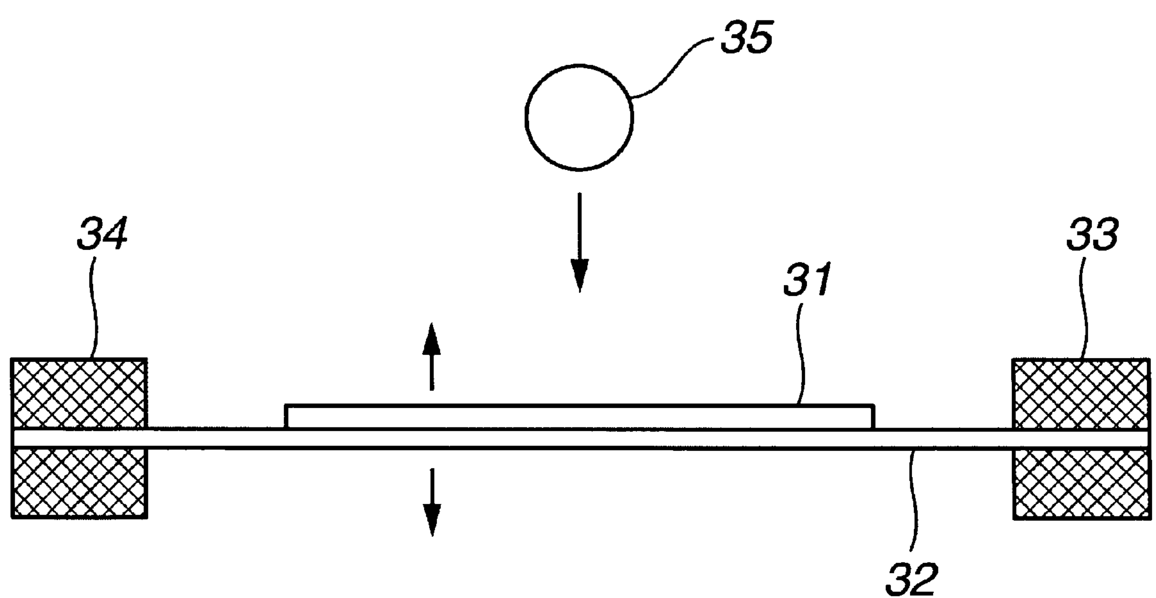
FIG. 7 is an explanatory view of a usual piezoelectric power generation device.
Figure 8:
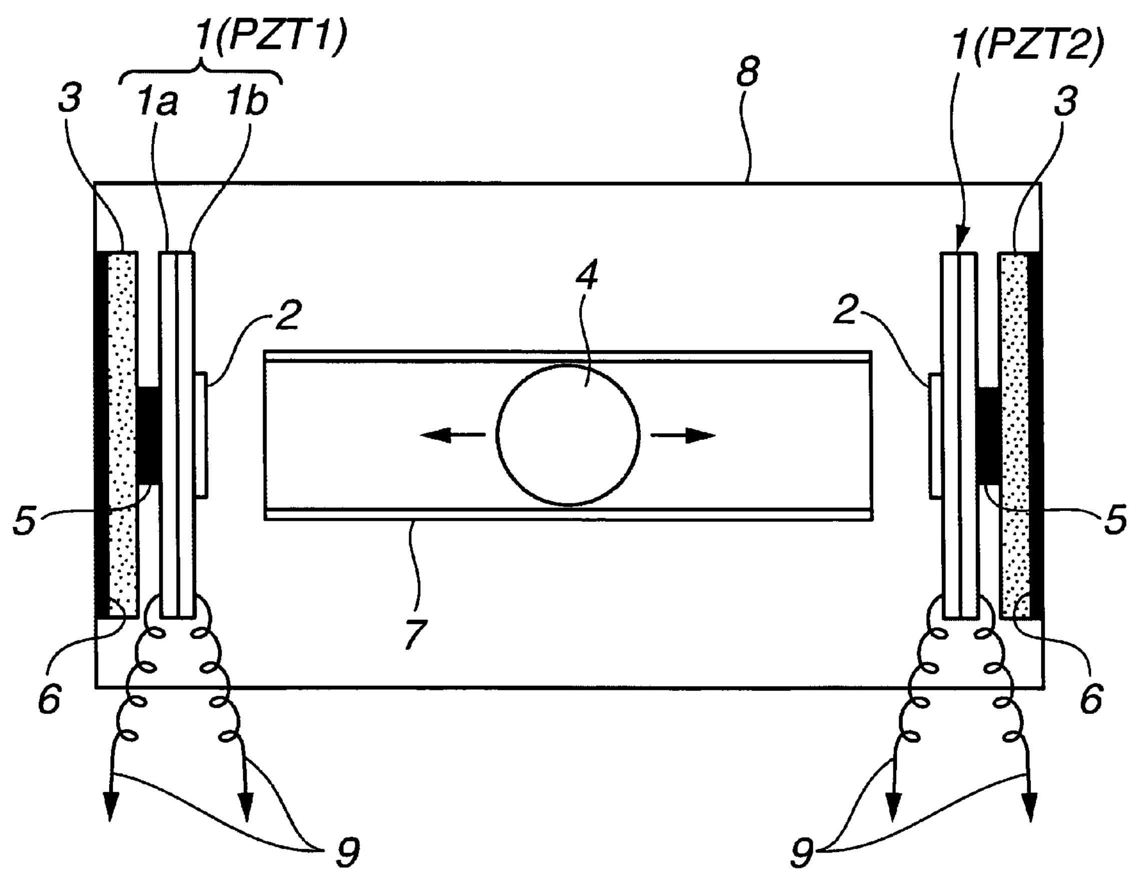
FIG. 8 is an explanatory view of a piezoelectric power generation device previously proposed by the applicant of the present invention.

FIGS. 6C and 6D show alternative examples of the embodiment B. These examples show that the connecting end part 11A relative to the lead wire 9C has a small width necessary for connection, which is different from the embodiment shown in FIGS. 4 and 5, so that factors of preventing an oscillation due to the connecting end part 11A of the metallic electrode 11 are eliminated as much as possible. According to the present invention, although there is not especially shown in the drawings, it is to be understood the plane and height dimensions of the piezoelectric ceramics element **10*a* or 10*b* may be formed to be equal, a cut-out part with a substantially recessed form in plan view may be formed for connecting the lead wire 9C in either the piezoelectric ceramics element 10*a* or 10*b* and the electrode 11** may be exposed and connected to the cut-out part.

The above-described charging device is used to form the parallel type piezoelectric power generation device. Thus, the power generation efficiency is improved to substantially twice as high as the power generation efficiency obtained by a usual piezoelectric power generation device. Accordingly, the power generation device is effective as a power source for a charger or a light-emitting device. Since the above-described power generation device has a simple structure, can obtain a larger quantity of output current and is economical, a more practical use may be anticipated. For instance, when the piezoelectric power generation device is mounted on a bicycle or shoes to light the light emitting diodes, the piezoelectric power generation device can be used as a device for allowing a presence to be recognized at night. Further, when the piezoelectric power generation device is mounted on a battery type wrist watch or a portable telephone, the power generation device can be employed in place of a battery or a countermeasure for an exhausted battery. Furthermore, the heaves of waves are used to generate power, so that a use of a lighting device for a buoy can be anticipated.

As described above, according to the present invention, in the piezoelectric power generation device, the two plate shaped piezoelectric ceramics elements are united together with the polarization set to the same direction and the extremely thin metallic electrode is interposed between the piezoelectric ceramics elements to form the piezoelectric ceramics member in a laminated shape. An impact load is applied to the piezoelectric ceramics members to generate power. Thus, output current can be obtained that is substantially twice as high as output current obtained in the series type piezoelectric power generation device previously proposed by the applicant of the present invention. Accordingly, an applicable field can be greatly increased to improve practicability.

Further, in the piezoelectric power generation device according to the present invention, because the piezoelectric ceramics members are supported by the cushion materials, the oscillation of the piezoelectric ceramics members can be effectively continued for a long time to improve the power generation efficiency.

Further, according to the present invention, because the piezoelectric ceramics elements having the same configurations are used to form the piezoelectric ceramics members in laminar shapes, the piezoelectric ceramics elements properly expand and contact to effectively more improve the power generation efficiency. Further, according to the present invention, because each of the piezoelectric ceramics elements is formed by uniting and laminating a plurality of elements, the strength of the piezoelectric ceramics elements can be effectively maintained.

Further, according to the present invention, a lead zirconate titanate based material is used for the piezoelectric ceramics elements to obtain a wide applicable range to the piezoelectric power generation device and effectively realize a practicability.

Further, according to the present invention, the metallic electrode is made of electrically conductive metal such as phosphor bronze or brass. The thickness of the metallic electrode is set to 10 μm to 50 μm. Thus, even when the flexural oscillation of the piezoelectric ceramics elements is generated to generate power, the metallic electrode does not substantially exhibit a mechanical resistance. Accordingly, the power generation efficiency is effectively hardly reduced.

Further, according to the present invention, the two piezoelectric ceramics elements are arranged uniformly in one end side, and, the end part of one piezoelectric ceramics element is formed to be longer than that of the other piezoelectric ceramics element in the other side to form a step part, and a lead wire connecting end part of the metallic electrode is extended and fixed to the step part. Accordingly, since the metallic electrode can be supported by the step part of the piezoelectric ceramics element high in its rigidity, the parasitic resonance (natural oscillation) of the protruding part of the metallic electrode can be prevented. At the same time, more effective power generation efficiency can be obtained and a connecting work of the lead wire to the metallic electrode can be simply carried out.

Still further, according to the present invention, both the end parts of the two piezoelectric ceramics elements are arranged uniformly, the metallic electrode protrudes outward from one end parts of both the piezoelectric ceramics elements, the lead wire is connected to the protruding part, and then, the protruding part is embedded in an adhesive to be formed integrally with the piezoelectric ceramics elements. Thus, the natural oscillation of the protruding part of the metallic electrode can be prevented, more effective power generation efficiency can be obtained and the lead wire can be simply connected to the metallic electrode.

What is claimed is:

1. A piezoelectric power generation device for generating power by applying distortion deformation to piezoelectric ceramics members formed in plate shapes, said piezoelectric power generation device comprising: two plate shaped piezoelectric ceramics elements included in each of the piezoelectric ceramics members whose polarization is set to the same direction and an extremely thin metallic electrode interposed between the piezoelectric ceramics elements, the piezoelectric ceramics member being formed in a laminar shape by uniting the piezoelectric ceramics elements to the metallic electrode; and cushion materials for supporting central parts or both end parts of one surfaces of the piezoelectric ceramics members, wherein the piezoelectric power generation device has a soft support structure in which the natural oscillation of the piezoelectric ceramics members is hardly transmitted to other structural members, wherein the piezoelectric ceramics member is formed by forming the two piezoelectric ceramics elements in the same configuration, and wherein both the end parts of the two piezoelectric ceramics elements are arranged uniformly, the metallic electrode protrudes from one end part of both the piezoelectric ceramics elements, the lead wire is connected to the protruding part, and then, the protruding part is embedded in an adhesive to be formed integrally with the piezoelectric ceramics elements.

2. The piezoelectric power generation device according to claim 1, the piezoelectric ceramics members supported by the cushion materials are opposed to each other and a hard striking member is provided between both the piezoelectric ceramics members which reciprocates between both the piezoelectric ceramics members to strike each piezoelectric ceramics member.

3. The piezoelectric power generation device according to claim 1, wherein a hard striking member is disposed in one or both sides of the piezoelectric ceramics members supported by the cushion materials, which reciprocates between the piezoelectric ceramics members to strike the piezoelectric ceramics members.

4. The piezoelectric ceramics member according to claim 1, wherein the two piezoelectric ceramics elements are respectively formed by uniting and laminating a plurality of sheets.

5. The piezoelectric ceramics member according to claim 1, wherein lead zirconate titanate based material is used as the piezoelectric ceramics elements.

6. The piezoelectric ceramics member according to claim 1, wherein the metallic electrode is made of electrically conductive metal such as phosphor bronze or brass.

7. The piezoelectric ceramics member according to claim 2, wherein the piezoelectric ceramics member is formed by forming the two piezoelectric ceramics elements in the same configuration.

8. The piezoelectric ceramics member according to claim 3, wherein the piezoelectric ceramics member is formed by forming the two piezoelectric ceramics elements in the same configuration.

9. The piezoelectric ceramics member according to claim 7, wherein the two piezoelectric ceramics elements are respectively formed by uniting and laminating a plurality of sheets.

10. The piezoelectric ceramics member according to claim 8, wherein the two piezoelectric ceramics elements are respectively formed by uniting and laminating a plurality of sheets.

11. The piezoelectric ceramics member according to claim 7, wherein lead zirconate titanate based material is used as the piezoelectric ceramics elements.

12. The piezoelectric ceramics member according to claim 8, wherein lead zirconate titanate based material is used as the piezoelectric ceramics elements.

13. The piezoelectric ceramics member according to claim 7, wherein the metallic electrode is made of electrically conductive metal such as phosphor bronze or brass.

14. The piezoelectric ceramics member according to claim 8, wherein the metallic electrode is made of electrically conductive metal such as phosphor bronze or brass.

15. The piezoelectric ceramics member according to claim 7, wherein the two piezoelectric ceramics elements are arranged uniformly in one end side, and, the other piezoelectric ceramics element is formed longer than one piezoelectric ceramics element in the other end side to form a step part, and a lead wire connecting end part of the metallic electrode is extended to the step part.

16. The piezoelectric ceramics member according to claim 8, wherein the two piezoelectric ceramics elements are arranged uniformly in one end side, and, the other piezoelectric ceramics element is formed longer than one piezoelectric ceramics element in the other end side to form a step part, and a lead wire connecting end part of the metallic electrode is extended to the step part.

17. The piezoelectric ceramics member according to claim 7, wherein both the end parts of the two piezoelectric ceramics elements are arranged uniformly, the metallic electrode protrudes from one end part of both the piezoelectric ceramics elements, the lead wire is connected to the protruding part, and then, the protruding part is embedded in an adhesive to be formed integrally with the piezoelectric ceramics elements.

* * * * *